US012648412B2

(12) United States Patent
Deng et al.

(10) Patent No.: US 12,648,412 B2
(45) Date of Patent: Jun. 2, 2026

(54) METHOD AND APPARATUS FOR HARD MASK DEPOSITION

(71) Applicant: ASM IP Holding, B.V., Almere (NL)

(72) Inventors: Shaoren Deng, Ghent (BE); David Kurt De Roest, Leuven (BE); Marko Tuominen, Helsinki (FI)

(73) Assignee: ASM IP Holding B.V., Almere (NL)

( * ) Notice: Subject to any disclaimer, the term of this patent is extended or adjusted under 35 U.S.C. 154(b) by 569 days.

(21) Appl. No.: 18/061,260

(22) Filed: Dec. 2, 2022

(65) Prior Publication Data
US 2023/0178371 A1 Jun. 8, 2023

Related U.S. Application Data

(60) Provisional application No. 63/286,160, filed on Dec. 6, 2021.

(51) Int. Cl.
*H01L 21/033* (2006.01)
*H10P 50/00* (2026.01)
*H10P 76/40* (2026.01)
*C23C 16/455* (2006.01)

(52) U.S. Cl.
CPC .......... *H10P 76/4085* (2026.01); *H10P 50/71* (2026.01); *H10P 76/405* (2026.01); *C23C 16/45529* (2013.01)

(58) Field of Classification Search
CPC ............. H01L 21/0332; H01L 21/0337; H01L 21/32139; H10P 76/4085; H10P 76/405; H10P 50/71
See application file for complete search history.

(56) References Cited

U.S. PATENT DOCUMENTS

| | | | |
|---|---|---|---|
| 8,956,971 | B2 | 2/2015 | Haukka |
| 9,257,303 | B2 | 2/2016 | Haukka |
| 9,679,808 | B2 | 6/2017 | Haukka |
| 9,895,715 | B2 | 2/2018 | Haukka |
| 10,049,924 | B2 | 8/2018 | Haukka |
| 10,177,025 | B2 | 1/2019 | Pore |
| 10,343,186 | B2 | 7/2019 | Pore |
| 10,373,820 | B2 | 8/2019 | Tois |
| 10,453,701 | B2 | 10/2019 | Tois |
| 10,456,808 | B2 | 10/2019 | Haukka |
| 10,695,794 | B2 | 6/2020 | Pore |
| 10,814,349 | B2 | 10/2020 | Pore |
| 10,854,460 | B2 | 12/2020 | Tois |
| 10,923,361 | B2 | 2/2021 | Tois |
| 11,081,342 | B2 | 8/2021 | Färm |
| 11,094,535 | B2 | 8/2021 | Tois |
| 11,145,506 | B2 | 10/2021 | Maes |
| 11,213,853 | B2 | 1/2022 | Haukka |

(Continued)

*Primary Examiner* — Walter H Swanson
(74) *Attorney, Agent, or Firm* — Banner & Witcoff, Ltd.

(57) ABSTRACT

The disclosure relates to methods of depositing an etch-stop layer on a patterned hard mask is disclosed. The method comprises providing a substrate comprising the patterned hard mask in a reaction chamber, selectively depositing passivation material on the first material; and selectively depositing an etch-stop layer on the on the second material. The patterned hard mask comprises a first material and a second material, and the second material forms partially the surface of the substrate. The disclosure further relates to a semiconductor structure, to a device and to a deposition assembly.

26 Claims, 5 Drawing Sheets

(56)     References Cited

U.S. PATENT DOCUMENTS

| | | | |
|---|---|---|---|
| 11,387,107 B2 | 7/2022 | Tois | |
| 11,389,824 B2 | 7/2022 | Pore | |
| 11,450,529 B2 | 9/2022 | Longrie | |
| 2020/0006073 A1* | 1/2020 | Smith | ..................... C23C 16/24 |
| 2020/0324316 A1 | 10/2020 | Pore | |
| 2021/0013145 A1 | 1/2021 | Gstrein | |
| 2021/0033977 A1* | 2/2021 | Raaijmakers | ........... G03F 7/265 |
| 2021/0175092 A1 | 6/2021 | Tois | |
| 2021/0262090 A1* | 8/2021 | Cheng | .............. H01L 21/02178 |
| 2021/0301391 A1 | 9/2021 | Givens | |
| 2021/0351031 A1 | 11/2021 | Färm | |
| 2021/0358739 A1 | 11/2021 | Tois | |
| 2021/0358745 A1 | 11/2021 | Maes | |
| 2022/0068634 A1 | 3/2022 | Deng | |
| 2022/0181163 A1 | 6/2022 | Illiberi | |
| 2022/0193720 A1 | 6/2022 | Haukka | |
| 2022/0208542 A1 | 6/2022 | Maes | |

* cited by examiner

FIG. 3A
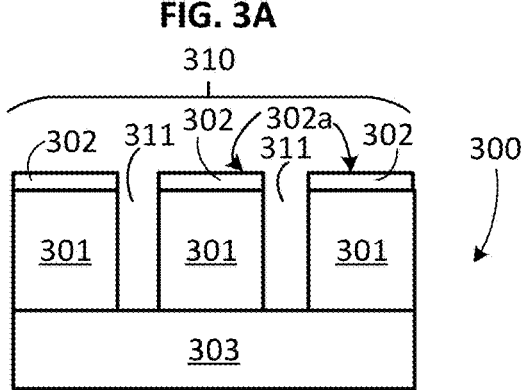
FIG. 3B
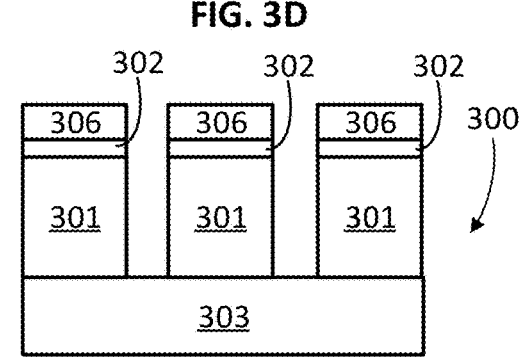
FIG. 3C
FIG. 3D
FIG. 3E
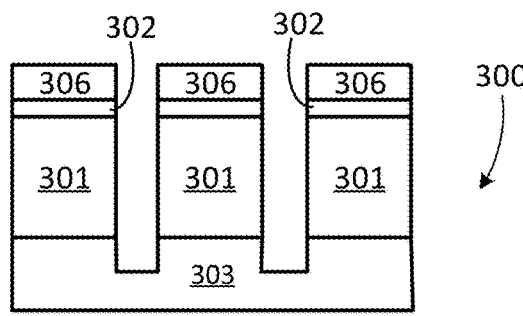

FIG. 4A
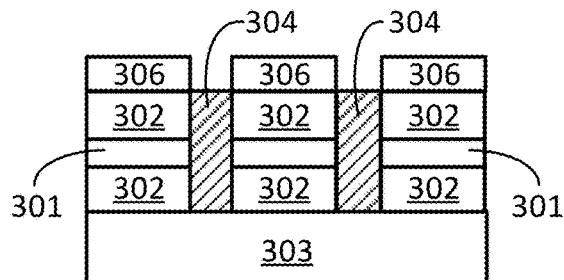
FIG. 4B
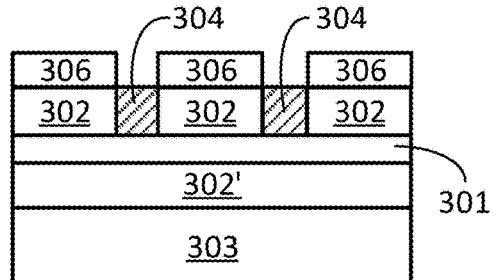
FIG. 4C
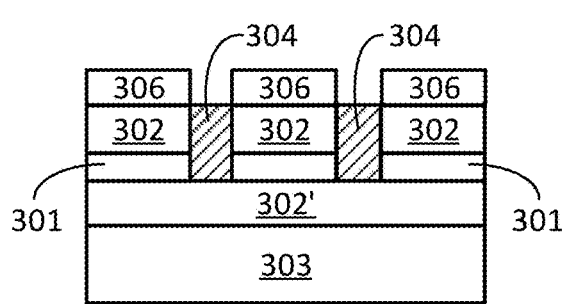
FIG. 4D
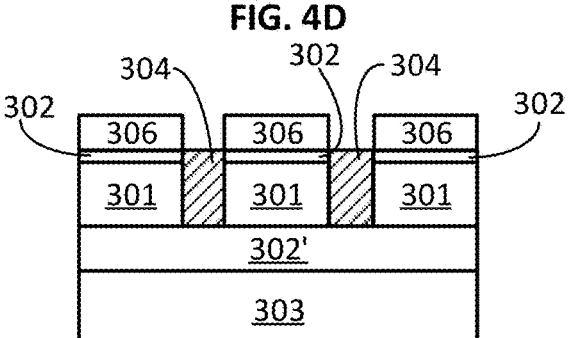
FIG. 4E

METHOD AND APPARATUS FOR HARD MASK DEPOSITION

FIELD

The present disclosure relates to methods and apparatuses for the manufacture of semiconductor devices. More particularly, the disclosure relates to methods and apparatuses for depositing a hard mask, and layers comprising hard mask material.

BACKGROUND

Semiconductor device fabrication processes generally use advanced methods for creating fine patterns of features on a surface of a substrate by patterning the surface of the substrate and removing material from the substrate surface using, for example, wet etch and/or dry etch processes. As a density of devices on a substrate increases, it becomes increasingly desirable to form features with smaller dimensions.

To regulate the areas from which material is removed, photoresists and hard masks may be used. However, the manufacture of advanced features, such as deep trenches with small critical dimensions, poses challenges for the current hard mask materials to avoid etching of the feature edges during prolonged and/or aggressive etching processes, and losing critical dimension control thereafter. Thus, new hard mask materials, as well as new methods to deposit them are sought in the art. Further, alternative methods of achieving etch selectivity are desired, to allow the use of various material combinations in semiconductor devices.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing a hard mask on a patterned surface of a substrate, to a hard mask layer, and to deposition assemblies for depositing a hard mask on a substrate. The methods and apparatuses disclosed herein offer the possibility to reduce hard mask thickness, or to omit some layers, while retaining, or improving fidelity of pattern transfer. This may allow cost reduction, and/or throughput increase in manufacturing of semiconductor devices.

In one aspect, a method of depositing an etch-stop layer on a patterned hard mask is disclosed. The method comprises providing a substrate comprising the patterned hard mask in a reaction chamber, selectively depositing passivation material on the first material; and selectively depositing an etch-stop layer on the on the second material. The patterned hard mask comprises a first material and a second material, and the second material forms partially the surface of the substrate.

In some embodiments, the second material partially overlaps the first material. In some embodiments, the hard mask comprises a gap extending through the hard mask. In some embodiments, the passivation material is deposited to substantially fill the gap. In some embodiments, the passivation material is deposited substantially conformally on side walls of the gap. In some embodiments, the passivation material forms an air gap in the gap. In some embodiments, the gap is formed in a third material.

In some embodiments, the first material comprises a metal. In some embodiments, the metal is a transition metal. In some embodiments, the transition metal is selected from a group consisting of molybdenum, copper, cobalt, ruthenium, tungsten, niobium, zirconium hafnium and titanium. In some embodiments, the first material is a high k material. In some embodiments, the first material comprises amorphous carbon. In some embodiments, the first material or the second material comprises photoresist material.

In some embodiments, the second material comprises silicon. In some embodiments, the second material comprises silicon oxide, silicon nitride, silicon carbide, silicon oxycarbide or a combination thereof. In some embodiments, the second material comprises carbon. In some embodiments, the second material comprises an oxide or a nitride. In some embodiments, the second material comprises titanium.

In some embodiments, the passivation material comprises an organic polymer. In some embodiments, the passivation material is deposited by a cyclic process. In some embodiments, the cyclic process comprises providing a first passivation material precursor and a second passivation material precursor alternately and sequentially into the reaction chamber. In some embodiments, the organic polymer comprises polyimide.

In some embodiments, the method comprises selectively blocking the second material before deposited the passivation material on the first material. In some embodiments, the blocking comprises a silylation treatment.

In some embodiments, the etch-stop layer comprises a metal oxide. In some embodiments, the metal of the etch-stop layer is selected from aluminum, yttrium, zirconium or combinations thereof. In some embodiments, the etch-stop layer comprises yttrium oxide. In some embodiments, the etch-stop layer is deposited by a cyclic deposition process. In some embodiments, the etch-stop layer is deposited by an ALD process. In some embodiments, the etch-stop layer is deposited by providing a first etch-stop material precursor and a second etch-stop material precursor into the reaction chamber alternately and sequentially.

In one aspect, a method of etching a substrate is disclosed. The method comprises providing a substrate comprising a patterned hard mask in a reaction chamber, selectively depositing passivation material on the first material, selectively depositing an etch-stop layer on the on the second material, and selectively etching material not covered by the hard mask. The patterned hard mask according to the current disclosure comprises a first material and a second material, and the second material forms partially the surface of the substrate. In some embodiments, the etching step creates a gate cut.

In another aspect, a semiconductor structure formed by a method according to the current disclosure is disclosed. In a further aspect, a semiconductor device comprising a structure according to the current disclosure is disclosed.

In yet another aspect, a deposition assembly for depositing an etch-stop layer on a patterned hard mask is disclosed. The deposition assembly comprises one or more reaction chambers constructed and arranged to hold the substrate, a precursor injector system constructed and arranged to provide a passivation material precursor and an etch stop material precursor into the reaction chamber in a vapor phase. The deposition assembly further comprises a first precursor vessel constructed and arranged to contain a passivation material precursor and a second precursor vessel constructed and arranged to contain an etch stop material precursor. The deposition assembly according to the current disclosure is constructed and arranged to provide the passivation material precursor and the etch stop material precursor via the precursor injector system to the reaction chamber to selectively deposit an etch-stop layer on the hard mask.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

FIGS. 2A-2C each provide a schematic presentation of a partially fabricated semiconductor device being etched.

FIGS. 3A-3E provide examples of a substrate an exemplary embodiment of a method according to the current disclosure FIGS. 4A-4E each provide a schematic presentation of further embodiments of exemplary substrates according to the current disclosure

DETAILED DESCRIPTION

Figure 1A:
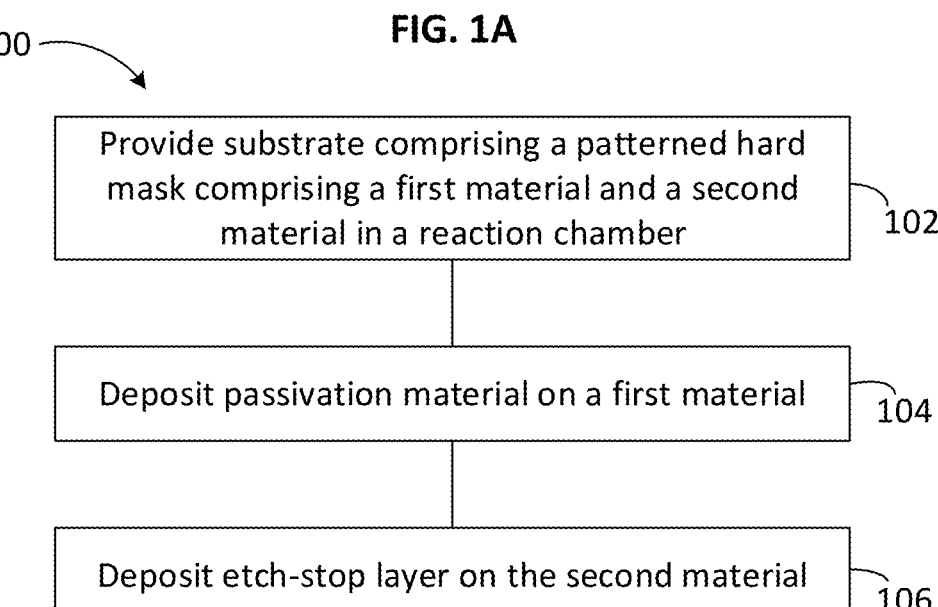
FIGS. 1A and 1B illustrate a block diagram of exemplary embodiments of a method according to the current disclosure.

The description of exemplary embodiments of methods, structures, devices and deposition assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations the stated features. For example, various embodiments are set forth as exemplary embodiments and may be recited in the dependent claims. Unless otherwise noted, the exemplary embodiments or components thereof may be combined or may be applied separate from each other. The headings provided herein, if any, are for convenience only and do not necessarily affect the scope or meaning of the claimed invention.

The present disclosure generally relates to methods of depositing a hard mask on a patterned surface of a substrate, to structures including the patterned features, i.e. formed using methods described herein, and to deposition assemblies for performing the methods according to the current disclosure. Features according to the current disclosure can be used in the formation of structures and devices, such as semiconductor devices. As described in more detail below, various methods can be used to form structures suitable for forming electronic devices.

Exemplary methods can be used to deposit an etch-stop layer on a patterned hard mask. Hard mask is generally used to guide etching of material to intended regions of layers on a semiconductor substrate. However, current hard mask materials may have drawbacks, as their etch resistance may not be sufficient for all applications. For example, shrinking dimensions of semiconductor devices pose challenges to the current hard mask materials in forming a gate cut into a partially fabricated device, as the edges of the hard mask surrounding the area to be etched may become etched and thus lead to inaccurate pattern transfer.

In the current disclosure, a hard mask is patterned. Thus, it comprises gaps extending therethrough. Material to be etched is positioned under the hard mask, and the etching will be performed on areas of the underlying material that are exposed to etching treatment through the gaps. Etching transfers the pattern downwards to the one or more layers beneath the hard mask-which may itself comprise one or multiple layers.

The gap thus defines the areas to be etched, and the accuracy of the pattern transfer by etching is dependent on the etching resistivity of the gap edge.

The etch-stop layer according to the current disclosure may have higher etch resistivity than the hard mask. Also in embodiments, in which the etch resistance of the etch-stop layer is not significantly higher than that of the hard mask, it may protect the underlying material so that the hard mask material is degraded less than it would be in the absence of the etch-stop layer. However, in some embodiments, the etch-stop layer has higher etch resistivity than the passivation material. Thus, the passivation material may be etched away without damaging the etch-stop layer. In some embodiments, the etch-stop layer is damaged, but the etch-stop layer reduces the damage to the underlying hard mask such that the critical dimension of the gap is altered during the etch process. Thus, the passivation material, and the underlying materials may be etched selectively. By selective etching means that the passivation material and/or materials under the passivation material exhibit an etch rate of greater than 20 times, greater than 10 times, or greater than 5 times the etch rate of the etch-stop layer.

In accordance with further embodiments of the disclosure, a structure is provided. The structure can be formed according to a method as set forth herein. In accordance with further examples of the disclosure, a device comprises or is formed using a structure as described herein.

In accordance with yet additional examples of the disclosure, a deposition assembly constructed and arranged to perform a method and/or to form a structure as described herein is provided.

In this disclosure, "gas" can include material that is a gas at normal temperature and pressure (NTP), a vaporized solid and/or a vaporized liquid, and can be constituted by a single gas or a mixture of gases, depending on the context. A passivation material precursor may be provided to the reaction chamber in gas phase. A hard mask precursor may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. However, a reactant may also contribute to the resulting compound or element in certain embodiments.

As used herein, "passivation material precursor" includes a gas or a material that can become gaseous and that can be used to deposit a passivation material, such as an organic polymer. In some embodiments, passivation material is deposited using a cyclic deposition process, in which two precursors are used. In such embodiments, the method comprises providing a first passivation material precursor and a second passivation material precursor into the reaction chamber in vapor phase.

As used herein, "hard mask precursor" includes a gas or a material that can become gaseous and that can be represented by a chemical formula that includes an element of the hard mask, such as a metal described herein. In embodiments, the hard mask is deposited using a cyclic deposition process, in which two precursors are used. In such embodiments, the method comprises providing a first hard mask precursor and a second hard mask precursor into the reaction chamber in vapor phase. In some embodiments, the hard mask is deposited using a cyclic deposition process, in which three or more precursors are used. In such embodiment, the method further comprises providing a third and optionally a further hard mask precursor into the reaction chamber in vapor phase.

In some embodiments, a precursor, such as a passivation material precursor or a hard mask precursor is provided in a mixture of two or more compounds. In a mixture, the other compounds in addition to the precursor may be inert compounds or elements. In some embodiments, a precursor is provided in a composition. Composition may be a solution or a gas in standard conditions.

In this disclosure, performing two processing phases continuously can refer to one or more of the following: without breaking a vacuum, without interruption as a timeline, without any material intervening step, without changing treatment conditions, immediately thereafter or as a next step.

As used herein, the term "layer" and/or "film" can refer to any continuous or non-continuous material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. In some embodiments, a layer according to the current disclosure is substantially continuous.

In the current disclosure, a deposition process may comprise a cyclic deposition process, such as an atomic layer deposition (ALD) process or a cyclic chemical vapor deposition (VCD) process. The term "cyclic deposition process" can refer to the sequential introduction of precursor(s) and/or reactant(s) into a reaction chamber to deposit material, such as passivation material or hard mask material, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. The process may comprise a purge step between providing precursors or between providing a precursor and a reactant in the reaction chamber.

The process may comprise one or more cyclic phases. For example, pulsing of two precursors may be repeated. In some embodiments, the process comprises or one or more acyclic phases. In some embodiments, the deposition process comprises the continuous flow of at least one precursor. In some embodiments, a precursor may be continuously provided in the reaction chamber. In such an embodiment, the process comprises a continuous flow of a precursor or a reactant. In some embodiments, one or more of the precursors and/or reactants are provided in the reaction chamber continuously.

The term "atomic layer deposition" (ALD) can refer to a vapor deposition process in which deposition cycles, such as a plurality of consecutive deposition cycles, are conducted in a reaction chamber. The term atomic layer deposition, as used herein, is also meant to include processes designated by related terms, such as chemical vapor atomic layer deposition, when performed with alternating pulses of precursor(s)/reactant(s), and optional purge gas(es). Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber. Thus, in some embodiments, the cyclic deposition process comprises purging the reaction chamber after providing a precursor into the reaction chamber. In some embodiments, the cyclic deposition process comprises purging the reaction chamber after providing a nitrogen precursor into the reaction chamber. In some embodiments, the cyclic deposition process comprises purging the reaction chamber after providing each precursor into the reaction chamber.

CVD-type processes typically involve gas phase reactions between two or more precursors and/or reactants. The precursor(s) and reactant(s) can be provided simultaneously to the reaction space or substrate, or in partially or completely separated pulses. The substrate and/or reaction space can be heated to promote the reaction between the gaseous precursor and/or reactants. In some embodiments the precursor(s)

and reactant(s) are provided until a layer having a desired thickness is deposited. In some embodiments, cyclic CVD processes can be used with multiple cycles to deposit a thin film having a desired thickness. In cyclic CVD processes, the precursors and/or reactants may be provided to the reaction chamber in pulses that do not overlap, or that partially or completely overlap.

As used herein, the term "purge" refers to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain or another means of separating the two spaces, to a second location to which a second precursor is continually supplied. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used.

In some embodiments, the cyclic deposition process according to the current disclosure comprises a thermal deposition process. In thermal deposition, the chemical reactions are promoted by increased temperature relevant to ambient temperature. Generally, temperature increase provides the energy needed for the formation of the target material in the absence of other external energy sources, such as plasma, radicals, or other forms of radiation. In some embodiments, the method according to the current disclosure comprises a plasma-enhanced deposition method, for example PEALD or PECVD. For example, in some embodiments, the hard mask deposition may be performed by PEALD or PECVD.

As used herein, silicon oxide refers to a material that includes silicon and oxygen. Silicon oxide can be represented by the formula $SiO_x$, where x can be between 0 and 2 (e.g., $SiO_2$). In some cases, the silicon oxide may not include stoichiometric silicon oxide. In some cases, the silicon oxide can include other elements, such as carbon, nitrogen, hydrogen, or the like.

Silicon carbide (SiC) can refer to a material that includes silicon and carbon. Silicon carbide need not necessarily be a stoichiometric composition. An amount of silicon can range from 5 to 50 at %; an amount of carbon can range from about 50 to about 95 at %. In some embodiments, SiC films may comprise one or more elements in addition to Si and C, such as H or N.

Silicon oxycarbide (SiOC) can refer to material that comprises silicon, oxygen, and carbon. As used herein, unless stated otherwise, SiOC is not intended to limit, restrict, or define the bonding or chemical state, for example, the oxidation state of any of Si, O, C, and/or any other element in the film. In some embodiments, SiOC thin films may comprise one or more elements in addition to Si, O, and C, such as H or N. In some embodiments, the SiOC films may comprise Si—C bonds and/or Si—O bonds. In some embodiments, the SiOC films may comprise Si—C bonds and Si—O bonds and may not comprise Si—N bonds. In some embodiments, the SiOC films may comprise Si—H bonds in addition to Si—C and/or Si—O bonds. In some embodiments, the SiOC films may comprise more Si—O bonds than Si—C bonds, for example, a ratio of Si—O bonds to Si—C bonds may be from about 1:10 to about 10:1. In some embodiments, the SiOC films may comprise from about 0% to about 50% carbon on an atomic basis. In some embodiments, the SiOC films may comprise from about 0.1% to about 40%, from about 0.5% to about 30%, from about 1% to about 30%, or from about 5% to about 20% carbon on an atomic basis. In some embodiments, the SiOC films may comprise from about 0% to about 70% oxygen on an atomic basis. In some embodiments, the SiOC films may comprise from about 10% to about 70%, from about 15% to about 50%, or from about 20% to about 40% oxygen on an atomic basis. In some embodiments, the SiOC films may comprise about 0% to about 50% silicon on an atomic basis. In some embodiments, the SiOC films may comprise from about 10% to about 50%, from about 15% to about 40%, or from about 20% to about 35% silicon on an atomic basis. In some embodiments, the SiOC films may comprise from about 0.1% to about 40%, from about 0.5% to about 30%, from about 1% to about 30%, or from about 5% to about 20% hydrogen on an atomic basis. In some embodiments, the SiOC films may not comprise nitrogen. In some other embodiments, the SiOC films may comprise from about 0% to about 40% nitrogen on an atomic basis (at %). By way of particular examples, SiOC films can be or include a layer comprising SiOCN. In some embodiments, silicon oxycarbide can be represented by the chemical formula $Si_2O_xC_y$, where z can range from about 0 to about 2, x can range from about 0 to about 2, and y can range from about 0 to about 5.

Silicon oxycarbonitride refers to material that comprises silicon, oxygen, nitrogen and carbon. As used herein, unless stated otherwise, SiOCN is not intended to limit, restrict, or define the bonding or chemical state, for example, the oxidation state of any of Si, O, C, N and/or any other element in the film. In some embodiments, SiOCN is material that can be represented by the chemical formula $Si_2O_xC_yN_w$, where z can range from about 0 to about 2, x can range from about 0 to about 2, y can range from about 0 to about 2, and w can range from about 0 to about 2.

A metal carbonitride refers to material that comprises a metal or a metalloid, carbon and nitrogen. refers to material that can be represented by the chemical formula $M_2O_xC_yN_w$, where z can range from about 0 to about 2, x can range from about 0 to about 2, y can range from about 0 to about 2, and w can range from about 0 to about 2. M can be a metal or metalloid, such as one or more of aluminum, titanium, tin, hafnium, zirconium, indium, antimony, tellurium, iodine, cesium, molybdenum, copper, cobalt, ruthenium, tungsten and niobium.

The term metal oxide can refer to metal that includes a metal or metalloid and oxygen. The metal or metalloid can be, for example, one or more of aluminum, titanium, tin, hafnium, zirconium, indium, antimony, tellurium, iodine, cesium, molybdenum, copper, cobalt, ruthenium, tungsten and niobium. The term metal carbide can refer to metal that includes a metal or metalloid and carbon. The metal or metalloid can be, for example, one or more of aluminum, titanium, tin, hafnium, zirconium, indium, antimony, tellurium, iodine, cesium, molybdenum, copper, cobalt, ruthenium, tungsten and niobium.

DRAWINGS

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements, such as thicknesses of material layers, in the figures may be exaggerated relative to other elements to help improve the understanding of illustrated embodiments of the present disclosure. The structures and devices depicted in the drawings may contain additional elements and details, which may be omitted for clarity.

FIG. 1A is a block diagram of exemplary embodiments of a method 100 according to the current disclosure. In the embodiments, an etch-stop layer is deposited on a patterned hard mask. A patterned hard mask according to the current disclosure is one or more material layers that function to guide subsequent etching processes to predetermined areas of the substrate located below the hard mask. The substrate typically comprises one or more layers below the hard mask that will contribute to the functioning of a semiconductor device. The patterned hard mask has been prepared by forming gaps, which may be of variable shape, into the hard mask material.

In one aspect, a method of depositing an etch-stop layer on a patterned hard mask is disclosed. The method comprises providing a substrate comprising the patterned hard mask in a reaction chamber, selectively depositing passivation material on the first material; and selectively depositing an etch-stop layer on the on the second material. The patterned hard mask comprises a first material and a second material, and the second material forms partially the surface of the substrate.

In the first phase 102 depicted in FIG. 1A, a substrate is provided into a reaction chamber. A substrate according to the current disclosure may comprise, for example, an oxide, such as silicon oxide (for example thermal silicon oxide or native silicon oxide), aluminum oxide, or a transition metal oxide, such as hafnium oxide. In some embodiments, as substrate comprises, consist essentially of, or consist of amorphous carbon, spin-on carbon, spin-on glass, amorphous silicon, or silicon carbide. A substrate may comprise, consist essentially of, or consist of a nitride, such as silicon nitride or titanium nitride, a metal, such as copper, cobalt, tungsten, molybdenum, or ruthenium, chalcogenide material, such as molybdenum sulfide. The substrate may comprise various layers forming parts of semiconductor devices. The hard mask has been deposited on the substrate and patterned by methods known in the art to form a patterned hard mask.

The reaction chamber can form part of an atomic layer deposition (ALD) assembly. The reaction chamber can form part of a chemical vapor deposition (CVD) assembly. The assembly may be a single wafer reactor. Alternatively, the assembly may be a batch reactor. The assembly may comprise one or more multi-station deposition chambers. Various phases of method 100 can be performed within a single reaction chamber or they can be performed in multiple reaction chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors. The etch-stop material according to the current disclosure may be deposited in a cross-flow reaction chamber. The etch-stop material according to the current disclosure may be deposited in a cross-flow reaction chamber.

The hard mask according to the current disclosure comprises a first material and a second material. In some embodiments, the hard mask comprises a third material. In some embodiments, the hard mask comprises a fourth or a further material. The materials of the hard mask may form layers. In some embodiments, the, the second material partially overlaps the first material. The second material is positioned closer to the upper surface (i.e. the surface exposed to ambient environment) of the hard mask. As the hard mask is patterned, the gaps extend through first material and second material. In embodiments in which the hard mask comprises a third or a further material, the gap may be formed through these materials as well. Thus, the gap has a side wall. The first material and the second material are exposed on the side wall, on an inside surface of the gap. The gap has a bottom. The bottom may be distinguishable from the side wall, or continuous with it, such as curved.

In some embodiments, the first material comprises, consists essentially of, or consists of a dielectric material. In some embodiments, the first material comprises, consists essentially of, or consists of a metallic material. In some embodiments, the first material comprises, consists essentially of, or consists of an elemental metal. In some embodiments, the first material comprises, consists essentially of, or consists of a material selected from a group consisting of metal oxide, metal nitride, metal carbide, metal oxycarbide and amorphous carbon. In some embodiments, the first material does not comprise silicon.

In some embodiments, the first material comprises a metal. In some embodiments, the metal is a transition metal. In some embodiments, the metal is a transition metal. In some embodiments, the transition metal is selected from a group consisting of molybdenum, copper, cobalt, ruthenium, tungsten, niobium, zirconium hafnium and titanium. In some embodiments, the first material is a high k material. In some embodiments, the first material comprises amorphous carbon. In some embodiments, the first material comprises, consists essentially of, or consists of, titanium nitride. In some embodiments, the first material comprises, consists essentially of, or consists of, titanium oxide. In some embodiments, the first material comprises, consists essentially of, or consists of, titanium oxynitride. In some embodiments, the first material comprises, consists essentially of, or consists of carbide material. In some embodiments, the carbide material is boron carbide.

In some embodiments, the second material is a dielectric material. In some embodiments, the second material comprises silicon. In some embodiments, the second material is a low-k material. In some embodiments, the second material comprises an oxide. In some embodiments, the second material comprises a nitride. Examples of silicon-comprising dielectric materials include silicon oxide-based materials, including grown or deposited silicon dioxide, doped and/or porous oxides and native oxide on silicon. In some embodiments, the second material comprises silicon oxide. In some embodiments, the second material is a silicon oxide material, such as a native oxide material, a thermal oxide material or a chemical oxide material. In some embodiments, the second material comprises SiN. In some embodiments, the second material comprises carbon. In some embodiments, the second material comprises SiOC.

In some embodiments, the second material may be a $SiO_2$-based surface. In some embodiments, the second material may comprise Si—O bonds. In some embodiments, the second material may comprise a $SiO_2$-based low-k material. In some embodiments, the second material may comprise more than about 30%, or more than about 50% of $SiO_2$. In certain embodiments the second material may comprise a silicon dioxide surface In the phase 104, passivation material is selectively deposited on the first material. Selectivity of the deposition can be given as a percentage calculated by [(deposition on first material)-(deposition on second material)]/(deposition on the first material). Deposition can be measured in a variety of ways. In some embodiments, deposition may be given as the measured thickness of the deposited material. In some embodiments, deposition may be given as the measured amount of material deposited. Thus, the passivation material grows preferentially on the first material, while it is deposited to a lesser extent, or not at all, on the second material. In some embodiments, deposition of the passivation material on the first material relative to the second material is at least about 90% selective, which may be selective enough for some particular applications. In some embodiments, deposition of the passivation material on the first material relative to the second material is at least about 80% selective, which may be selective enough for some particular applications. In some embodiments the deposition on the first material relative to the second material is at least about 50% selective, which may be selective enough for some particular applications.

In some embodiments the dielectric material comprises a metal oxide. In some embodiments, the second material is a high-k material, such as hafnium oxide-comprising material, a lanthanum oxide-comprising material.

In some embodiments, the passivation material is deposited to substantially fill the gap. In some embodiments, the passivation material is deposited until its surface is substantially flush with the surface of the second material. In some embodiments, the passivation material is deposited until it grows out of the gap. In some embodiments, the passivation material is not deposited laterally outside the gap. In some embodiments, the passivation material is deposited laterally outside the gap. In some embodiments, the method according to the current disclosure comprises an etch-back phase to adjust the surface of the passivation material. In some embodiments, trimming of the substrate after depositing passivation material comprises an etch-back of the passivation material.

The purpose of depositing passivation material inside the gap is to avoid the deposition of etch-stop material in the gap. The passivation material is a sacrificial material that is not necessarily present in the final structure or device according to the current disclosure. Therefore, the deposition of the passivation material does not need to be uniform in the gap, and the deposition of the passivation material does not need to fill the gap completely. Therefore, the passivation material may form an air gap in the gap. In other words, the gap can be pinched off by the growth of the passivation material, leaving an empty cavity inside the gap. Without limiting the current disclosure to any specific theory, gravity or other physical conditions may affect the passivation material also after deposition. Thus, in some embodiments, the passivation material may collapse, or otherwise deform so that the cavity is not visible, or present. Further, the surface of the passivation material may be uneven, concave or otherwise uneven. The uniformity and possible presence of an air gap in the gap may vary according to the composition and/or layer structure of the hard mask. In some embodiments, there are other materials exposed on the inside surface of the gap in addition to the first material. The passivation material may or may not be deposited on such additional materials. For example, in some embodiments, second material may be present on the inside of the gap. Although the second material is the topmost layer of the hard mask, there may be one or more additional layers of the second material either above or below the first material.

In embodiments, in which the inside surface of the gap comprises further materials in addition to the first material, and the passivation material is not deposited on such materials, the growth of the passivation material may be uneven. However, the passivation material is inherently deposited on itself. It will therefore reach the top of the gap even in embodiment in which the inside surface of the gap contains materials on which the passivation material does not deposit.

In some embodiments, the passivation material is deposited substantially conformally on side walls of the gap. Especially in embodiments, in which the passivation material grows on all surfaces below a layer of second material forming surface of the substrate, the deposition of passivation material may be substantially or fully conformal.

In some embodiments, the process according to the current disclosure comprises depositing a passivation material on the first material to selectively passivate the first material for selectively depositing an etch-stop layer on the second material. In some embodiments, the passivation material comprises an organic polymer. The passivation material may be deposited by a cyclic vapor deposition process. The deposition of passivation material may comprises providing a first passivation material precursor, such as acetic anhydride, and a second passivation material precursor, such as a diamine, alternately and sequentially into the reaction chamber. An organic polymer passivation layer may be selectively formed on the first (for example metal-containing) material relative to the second material by providing a passivation agent into the reaction chamber. A passivation material may be provided by a cyclic deposition process. For example, polyimide-comprising passivation material may be deposited by providing an acetic anhydride and a diamine alternately and sequentially into a reaction chamber to form a passivation material on the first surface. The passivation material may be selectively deposited on the first material by providing a passivating agent into the reaction chamber. In some embodiments, the passivating material on the metal, metallic or dielectric first surface inhibits, prevents or reduces the formation of the etch-stop layer on the first surface.

In some embodiments, the cyclic process comprises providing a first passivation material precursor and a second passivation material precursor alternately and sequentially into the reaction chamber.

At phase 106, an etch-stop layer is selectively deposited on the second material. At this stage, the surface of the substrate comprises the second material and the passivation material, and the etch-stop material is selectively deposited on the second material relative to the passivation material. In some embodiments, the etch-stop layer is deposited by a cyclic deposition process. In some embodiments, the etch-stop layer is deposited by providing a first etch-stop material precursor and a second etch-stop material precursor alternately and sequentially into the reaction chamber. In some embodiments, an ALD process is used in depositing the etch-stop layer. In some embodiments, a cyclic CVD process is used in depositing the etch-stop layer.

In some embodiments, the etch-stop layer comprises a metal oxide. In some embodiments, the etch-stop layer comprises a metal oxide comprising two metals. In some embodiments, the etch-stop layer comprises a metal oxide comprising three metals. In some embodiments, the metal of the etch-stop layer is selected from titanium, aluminum, yttrium, zirconium or combinations thereof. In some embodiments, the etch-stop layer comprises, consists essentially of, or consists of titanium oxide. In some embodiments, the etch-stop layer comprises, consists essentially of, or consists of aluminum oxide. In some embodiments, aluminum oxide is doped with another metal. In some embodiments, the etch-stop layer comprises, consists essentially of, or consists of yttrium oxide. In some embodiments, yttrium oxide is doped with another metal. In some embodiments, the etch-stop layer comprises, consists essentially of, or consists of zirconium oxide. In some embodiments, the etch-stop layer comprises, consists essentially of, or consists of aluminum-doped yttrium oxide. In some embodiments, the etch-stop layer comprises, consists essentially of, or consists of yttrium-doped aluminum oxide. In some embodiments, the etch-stop layer comprises, consists essentially of, or consists of zirconium-doped aluminum oxide. In some embodiments, the etch-stop layer comprises, consists essentially of, or consists of zirconium-doped yttrium oxide. In some embodiments, the etch-stop layer comprises, consists essentially of, or consists of yttrium silicon oxide. In some embodiments, the etch-stop layer comprises a nitride. In some embodiments, the nitride is titanium nitride or titanium oxynitride.

Figure 1B:
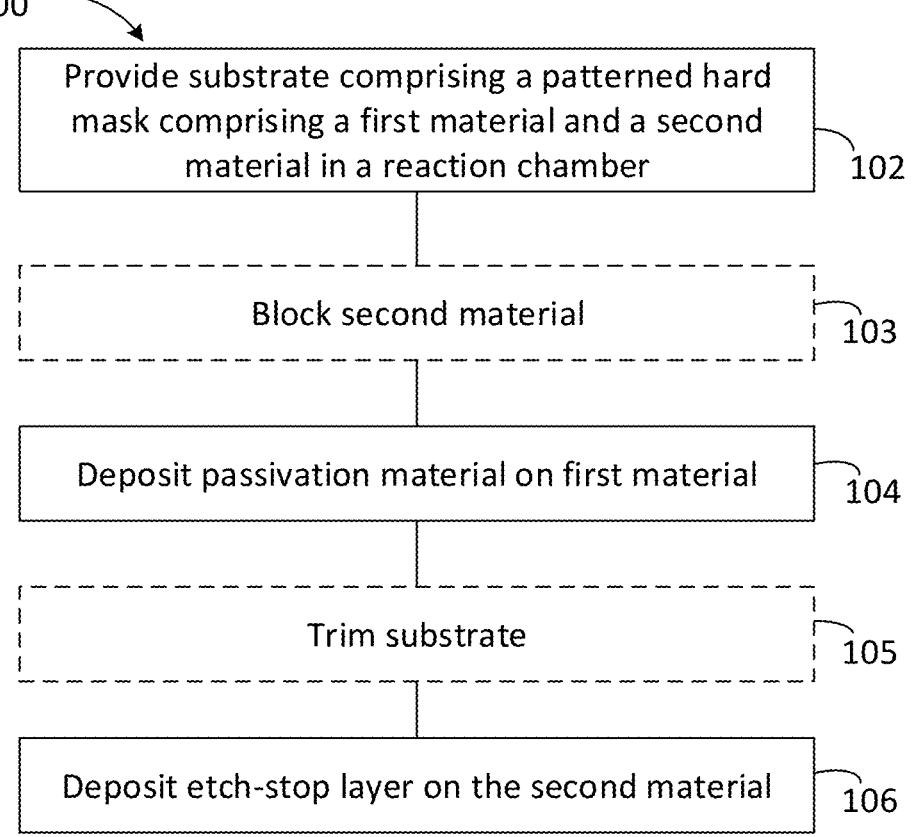

FIG. 1B is a block diagram of other exemplary embodiments of a method according to the current disclosure. Phases 102, 104 and 106 are as presented for FIG. 1A above. However, in embodiments of FIG. 1B, an additional phase 103 of blocking the second material is performed before depositing the passivation material at phase 104. The purpose of the blocking phase 103 may be to enable or improve the selective deposition of the passivation material on the first material. The nature of the blocking phase 104 depends on the materials used in the embodiment in question. In some embodiments, blocking is performed by exposing the substrate to a blocking chemistry, which may modify and/or adsorb on the first material. Blocking may also be performed by cleaning one or both of first material surface and second material surface, by reducing the surfaces etc.

In some embodiments, blocking may be performed by a silylation treatment. A silylating agent such as alyltrimethylsilane (TMS-A), chlorotrimethylsilane (TMS-CI), N-(tri-menthylsilyl) imidazole (TMS-Im), octadecyltrichlorosilane (ODTCS), hexamethyldisilazane (HMDS), or N-(trimethylsilyl) dimethylamine (TMSDMA) may be used to silylate the second material. The substrate may be contacted with a sufficient quantity of the blocking agent and for a sufficient period of time that the second surface is selectively blocked with silicon species. In some embodiments, the second material is not passivated with a self-assembled monolayer.

For the embodiments illustrated in FIG. 1B, the substrate may be trimmed at phase 105 after depositing the passivation material. Trimming may comprise etching back the passivation material to remove any non-selectively deposited material, removing optional blocking agent from the second surfaces of the hard mask or other treatment. Trimming 105 may be performed by a plasma treatment. In some embodiments, the plasma may comprise oxygen atoms, oxygen radicals, oxygen plasma, or combinations thereof. In some embodiments, the plasma treatment may be performed by hydrogen-comprising plasma. In some embodiments, the plasma may comprise hydrogen atoms, hydrogen radicals, hydrogen plasma, or combinations thereof. In some embodiments, the plasma may comprise noble gas species, for example Ar or He species. In some embodiments, the plasma may consist essentially of noble gas species. In some embodiments, the plasma may comprise other species, for example nitrogen atoms, nitrogen radicals, nitrogen plasma, or combinations thereof. In some embodiments, the trimming may comprise exposing the substrate to an etchant comprising oxygen, for example $O_3$. In some embodiments, the substrate may be exposed to an etchant at a temperature of between about 30° C. and about 450° C., or between about 100° C. and about 400° C. In some embodiments, the etchant may be supplied in one continuous pulse or may be supplied in multiple pulses In some embodiments, trimming comprises annealing the passivation material. In some embodiments, annealing may be carried out after etching back. Annealing may be carried out in the same reaction chamber as the deposition of the passivation material, the same reaction chamber as the etch-back process, or may be carried out in a separate reaction chamber from one or more of those aspects of the process. In some embodiments annealing is carried out in a reaction chamber that is part of a cluster tool and the substrate is moved to one or more different reaction chambers of the cluster tool for additional processing after annealing.

In some embodiments the substrate is annealed for a period of about 1 to about 15 minutes. In some embodiments the substrate is annealed at a temperature of about 200 to about 500° C. In some embodiments the anneal step comprises two or more steps in which the substrate is annealed for a first period of time at a first temperature and then annealed for a second period of time at a second temperature.

Both phases 103 and 105 are optional, and only one of them or both can be performed. In some embodiments, either blocking 103, trimming 105 or both may comprise more than one treatment, such as plasma clean and oxidation or reduction.

Figure 2A:
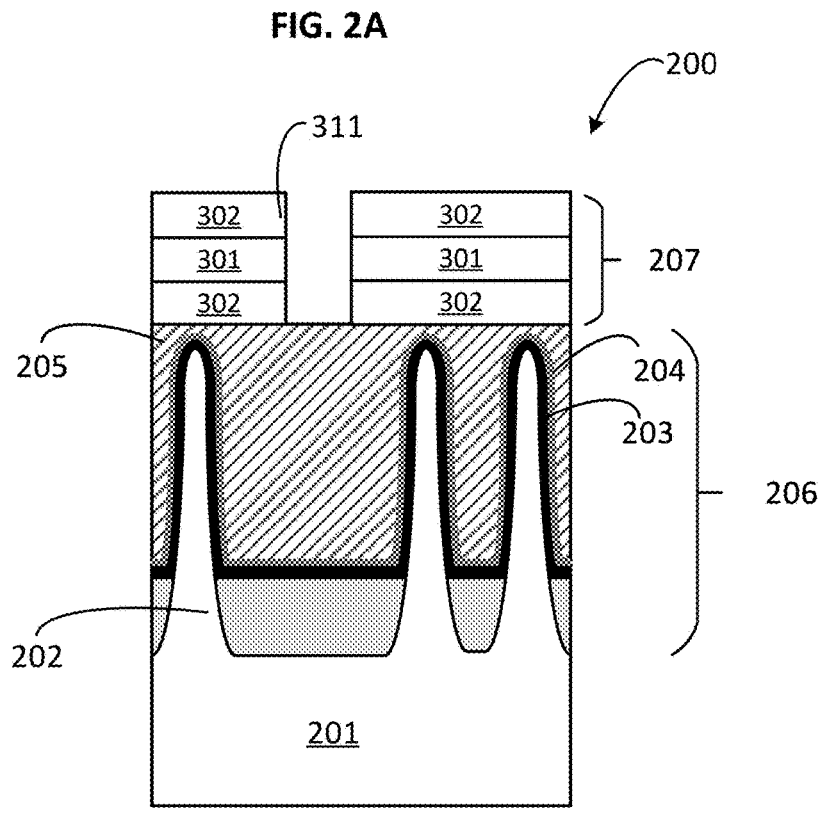
Figure 2A:
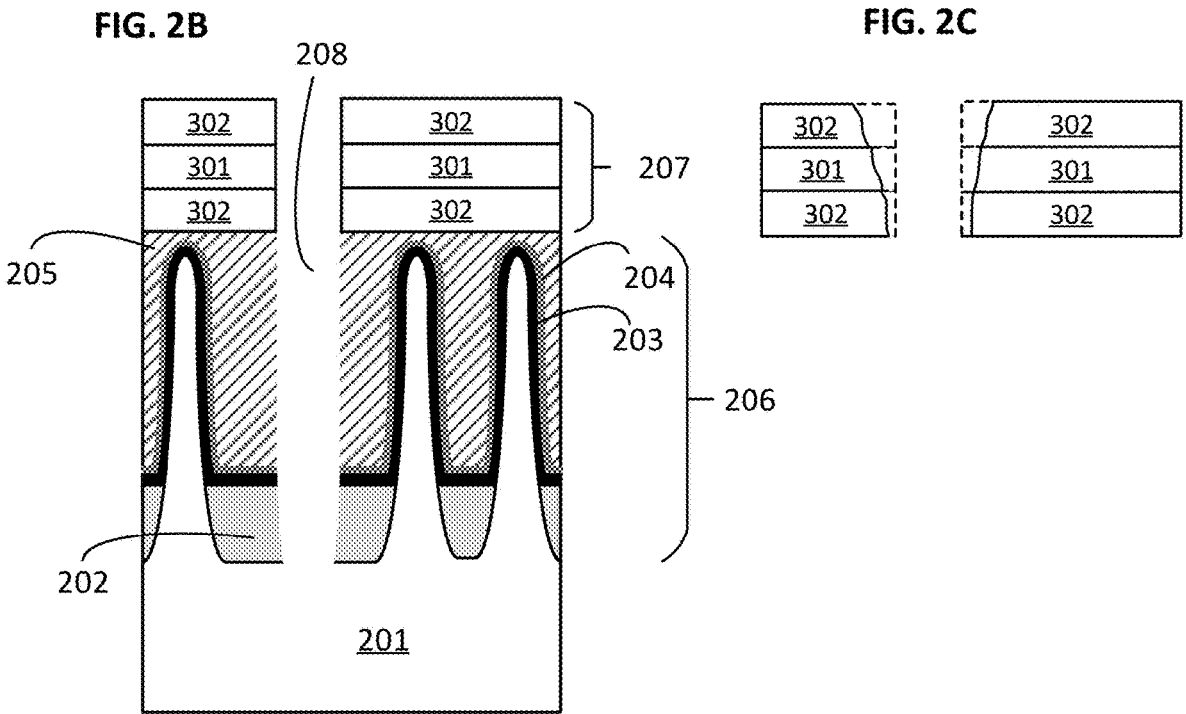

FIGS. 2A-2E provide a schematic illustration of a metal gate cut etched into a substrate comprising a patterned feature. FIG. 2A indicates a semiconductor substrate 200 comprising semiconductor structures 206 formed on silicon substrate 201. The structures in FIGS. 2A and 2B are FinFET gates, including the silicon fins, isolating STI oxide 202 and other functional layers, such as. high-k material 203 and a work function metal 204. The structures have been covered with gapfill material 205, which may be any of various materials depending on the position along the fins.

For example, the gapfill material 205 may comprise a metal, for example Co or W. Alternatively, the gapfill material may be oxide material, such as $SiO_2$, SiOC, SION, SiOCN. The current disclosure is not limited to devices described above, but the current method of depositing an etch-stop layer on a hard mask can find use in various processing schemes in the manufacture of semiconductor devices. For example, in bit line etch in 3D-VNAND, DRAM capacitor cell, gate cut for gate all around, in addition to FinFET.

A patterned hard mask 207 covers the substrate 200. The first material layer of the hard mask is indicated by 301, and in the embodiment of FIG. 2A it is sandwiched between two layers of the second material 302. The second material forms the topmost surface of the hard mask 207. In the embodiment of FIGS. 2A-2C, the first material 301 may be, for example, titanium nitride, titanium oxide, titanium oxynitride or amorphous carbon, and the second material 302 may be, for example, silicon nitride, silicon oxide, spin-on glass, amorphous silicon or Silicon oxycarbide. The hard mask comprises a gap 311 that has been formed in the hard mask by conventional pattern transfer methods.

FIG. 2B indicates an ideal ready-formed gate cut 208 extending from the gap 311 of FIG. 2A through the above-indicated layers 205, 204, 203 and 202 to the silicon substrate 201. In FIG. 2B, the desired outcome is drawn, in which edges of the hard mask 207 remain substantially as they were before etching through the device 206 structures. FIG. 2C illustrates a damaged hard mask after prior-art etching process has been completed. In FIG. 2C the edges of the hard mask 207 have eroded, causing inaccuracy in the pattern transfer through the device 206 structures. The original gap dimensions are indicated with dashed line in FIG. 2C, and the post-etching edge with a solid line. Shrinking of device dimensions makes the effects of the erosion indicated in FIG. 2C more pronounced. To mitigate the problem, more etch-resistant hard mask materials are sought in the art. However, accurate patterning of the hard mask structure may be more difficult with highly etch-resistant hard mask materials.

Area-selective deposition of an etch-stop layer on hard mask material may help solve the above-described problem. A hard mask may be deposited and patterned, after which the etch-stop layer is deposited only on areas of the substrate covered by the hard mask, and leaving the gaps—i.e. areas to be etched—free of etch-stop material. The etch-stop material may be formed from a very etch-resistant material, since suitability to the patterning process does not need to be considered.

FIGS. 3A-3E provide schematic illustration of examples of a substrate comprising a patterned surface at different phases of a method according to the current disclosure. FIG. 3A indicates a substrate 300 comprising a patterned hard mask 310 before the deposition of a passivation material. The patterned hard mask 310 comprises a gap 311 formed in a first material 301 and in a second material 302. Thus, the hard mask comprises a gap extending through the hard mask.

The second material 302 overlaps the first material 301. The second material 302 forms the surface 302a of the patterned hard mask 310. The first material 301 may comprise any material that has suitable properties to be used in a hard mask. The second material 302 may comprise, consist essentially of, or consist of any material that has suitable properties to be used in a hard mask, and allows the selective deposition of passivation material in the gap 311 only.

In some embodiments, the first material 301 comprises, consists essentially of, or consists of a metal. In some embodiments, the first material comprises a metal. In some embodiments, substantially all of the metal is in an elemental form. In some embodiments, the metal is in a compound and has a formal oxidation state higher than 0. In some embodiments, the metal is in a metal nitride. In some embodiments, the metal nitride is a titanium nitride or titanium oxynitride. In some embodiments, the metal is in a metal oxide. In some embodiments, the metal oxide is aluminum oxide, hafnium oxide, zirconium oxide, titanium oxide. In some embodiments, the metal is in a metal carbide. In some embodiments, the metal carbide is titanium aluminum carbide or titanium carbide. In some embodiments, the metal is a transition metal. In some embodiments, the transition metal is selected from a group consisting of molybdenum, copper, cobalt, ruthenium, tungsten, niobium, zirconium hafnium and titanium.

In some embodiments, the first material 301 comprises, consists essentially of, or consists of a high k material. In some embodiments, the high k material is selected from a group consisting of hafnium oxide, zirconium oxide, aluminum oxide (such as $Al_2O_3$) or a combination thereof.

In some embodiments, the first material 301 comprises carbon. In some embodiments, the first material 301 consists essentially of or consists of carbon and hydrogen. In some embodiments, the carbon comprises, consists essentially of, or consists of amorphous carbon. In some embodiments, the carbon comprises, consists essentially of, or consists of spin-on carbon (SOC). In some embodiments, the first material 301 consists essentially of or consists of carbon and boron. In some embodiments, the first material 301 consists essentially of or consists of carbon-doped titanium nitride, titanium oxide or titanium oxynitride.

In some embodiments, the first material 301 or the second material 302 comprises photoresist material. In some embodiments, the first material 301 forms a layer. In some embodiments, the second material 302 forms a layer. In some embodiments, the first material 301 forms a layer, and the layer is an underlayer. In some embodiments, the first material 301 forms a layer, and the layer is a photoresist.

In some embodiments, the second material 302 comprises silicon. In some embodiments, the second material 302 comprises, consists essentially of, or consists of a silicon-containing compound. In some embodiments, the silicon-containing compound is selected from a group consisting of $SiO_2$, SIN, SION, SiC, SiOC, SiOCN. In some embodiments, the silicon-containing compound comprises a metal, such as aluminum or titanium.

In some embodiments, the second material 302 comprises silicon oxide. In some embodiments, the second material 302 comprises silicon nitride. In some embodiments, the second material 302 comprises silicon carbide. In some embodiments, the second material 302 comprises silicon oxycarbide. In some embodiments, the second material 302 comprises a combination of two or more compounds selected from silicon oxide, silicon nitride, silicon carbide and silicon oxycarbide.

In some embodiments, the second material comprises carbon. In some embodiments, the second material comprises an oxide or a nitride. In some embodiments, the second material comprises titanium.

The material under the hard mask 310, i.e. the surface that has been exposed by patterning of the hard mask, may vary. Its composition may not be relevant—or at least essential—for the functioning of the process according to the current disclosure, since the passivation material does not need to grow in a bottom-up fashion. Instead, in some embodiments, it may even be beneficial that the passivation material growth begins closer to the gap 311 opening to the surface 302a of the hard mask 310. The growth initiation of the passivation material from the vicinity of the gap 311 opening may allow faster closure ("pinch-off") of the gap 311, leading to reduced processing time compared to bottom-up growth. In some embodiments, the material 303 may be gapfill material, such as STI oxide, metal, such as tungsten, ruthenium, molybdenum, cobalt or copper, silicon-based materials, high k material or another metal oxide or a metal nitride.

FIG. 3B shows the substrate 300 after passivation material 304 has been deposited in the gap 311. In the embodiment of FIG. 3B, the first material 301 may be titanium nitride, titanium oxide, titanium oxynitride or amorphous carbon and the second material may be silicon oxide, silicon nitride, spin-on glass, amorphous silicon or silicon oxycarbide. The underlying material 303 is a material on which the passivation material 304 does not grow under the conditions in question. The underlying material 303 may be, for example, a silicon-based material. The gap 311 according to the current disclosure may have a width of, for example, from about 8 nm to about 150 nm, such as from about 10 nm to about 80 nm, or from about 20 nm to about 50 nm.

The growth of the passivation material 304 is indicated schematically in FIG. 3B. It is depicted to grow from the side walls, and due to the selected process conditions, it has pinched off the gap 311 and caused the gap opening to be closed, while leaving an air gap in the lower part of the gap. The surface of the passivation material exposed to the ambient (i.e. covering the gap opening) has been drawn straight. However, it is possible that the surface of the passivation material 304 is concave, or otherwise curved. In the embodiment depicted in FIG. 3B, the passivation material 304 surface is on the level of the border between first material 301 and second material 302. This is to indicate that the selective deposition of the passivation material 304 may be very selective, and the passivation material substantially does not grow on the second material 302. However, in reality, it may be desired that the passivation material 304 is deposited further up. Even if the passivation material 304 is not deposited on the second material 302, it may fill the whole gap 311 and even grow out. However, in some embodiments, lateral growth of the passivation material 304 is limited. If the passivation material is allowed to grow above the surface of the second material 302a, it may help avoiding the lateral growth of the etch-stop material on the gap 311 (cf. FIG. 3C).

The second material 302 may be selectively blocked from the deposition of a passivation material 304. In some embodiments, the hard mask is subjected to a blocking treatment, such as a silylation treatment described above, to obtain sufficient selectivity. Thus, in some embodiments, the method comprises selectively blocking the second material before deposited the passivation material on the first material. In some embodiments, the blocking comprises a silylation treatment. In such a case, the passivation material 304 may be, for example organic polymer comprising polyimide. The polyimide passivation material may comprise polyamic acid. In some embodiments, the organic polymer comprises polyimide.

FIG. 3C depicts a similar embodiment of a hard mask as FIG. 3B. However, in the embodiment of FIG. 3C, the passivation material 304 has substantially filled the gap 311 without leaving an air gap. This may, for example, relate to the underlying material 303 comprising material on which the passivation material 304 may grow. For example, in embodiments, in which the passivation material comprises polyimide, the underlying material 303 may comprise silicon oxide or silicon nitride. Further, the passivation material 304 has been indicated to have grown past the border between the first material 301 and the second material 302.

In FIG. 3C, an etch-stop layer 306 has been deposited on the hard mask. The etch-stop layer is substantially not deposited on the passivation material 304 covering the gap 311 of the hard mask. In case the passivation material 304 comprises polyimide, metal oxides, such as aluminum oxide, yttrium-doped aluminum oxide or yttrium oxide may be used as the etch-stop layer 306 material. Depositing the passivation material 304 allows the protection of the areas between gaps 311 from subsequent etching treatment, as depicted in FIG. 3D, in which the passivation material 304 has been remove by etching. In FIG. 3E, etching has been performed further, and the underlying material 303 is being etched. The etching of FIG. 3E may be performed to a depth necessary for the application in question, and it can be performed through multiple material layers of varying thickness, although only a single material with a shallow etch is depicted in FIG. 3E.

FIGS. 4A-4E provide further schematic illustration of exemplary substrates comprising a patterned structure according to the current disclosure.

FIG. 4A depicts an embodiment of a current disclosure in which the first material 301 is titanium nitride, and it is positioned between two layers of second material 302 of silicon nitride. The passivation material 304 comprises to a large extent of polyimide polymers, with possibly some polyamic acid included in the material. The second material has been blocked by a silylation treatment alyltrimethylsilane (TMS-A), chlorotrimethylsilane (TMS-CI), N-(trimenthylsilyl) imidazole (TMS-Im), octadecyltrichlorosilane (ODTCS), hexamethyldisilazane (HMDS) or N-(trimethylsilyl) dimethylamine (TMSDMA). to improve the selectivity between the first material 301 and second material 302. For example, a temperature during the silylation process may be from about 50° C. to about 500° C., or from about 100° C. to about 300° C. Due to the blocking treatment, the etch-stop material 306 of metal oxide, such as aluminum oxide-containing oxide, is selectively deposited on the second material 302. This may allow accurate etching of the metal 303 on areas of the gaps in the hard mask.

FIG. 4B depicts an embodiment in which the pattern transfer through the hard mask is not complete. The pattern has been transferred to the topmost layer of second material 302, in this case silicon nitride, whereas the underlying titanium nitride layer 301 and the second silicon nitride layer 302' have not been patterned. This embodiment illustrates that in some embodiments, it may be advantageous to initially etch the hard mask as thinly as possible, just to allow the selective deposition of the etch-stop layer 306, after which the etching may be performed with reduced damage to the hard mask. The first material layer 301 (TiN) may be exposed to allow the growth of the passivation material from the bottom of the gap, as the passivation material 304 does not deposit on the second material 302 (SIN). The underlying layer 303 may be metal or other material of interest.

FIG. 4C is another embodiment of a partially patterned hard mask, in which the topmost silicon nitride layer 302 and the titanium nitride layer 301 immediately below the silicon nitride layer 302 is patterned, but the second silicon nitride layer 302' is not. The depth of the hard mask patterning before the deposition of the etch-stop layer 306 may be selected based on the hard mask materials and the thickness of the layers used.

FIG. 4D indicates an embodiment of the current method, where, as in FIG. 4C the topmost layer of the second material 302 and the first material layer 301 are patterned, but the lower layer 302' of the second material is not. In this embodiment, the second material 301 is silicon oxide. It should be noted that the layer 302' indicated int the drawings may be replaced by a third hard mask material. In the embodiment of FIG. 4D, the topmost silicon nitride layer 302 has been included in the hard mask stack for the purpose of preventing etch-stop layer 306 growth on the hard mask. The topmost silicon nitride layer 302 is thin, for example less than 15 nm, or less than 10 nm in thickness. In some embodiments, the layer 302 is a substantially or completely closed layer with minimum thickness needed for a closed layer. In some embodiments, the thickness of the layer is from about 0.5 nm to about 3 nm, such as about 1 nm or about 2 nm. Generally, it may be sufficient to deposit a closed layer, so that contamination of the hard mask surface by the passivation material 304 is prevented. In the embodiment of FIG. 4D the first material comprises carbon. For example, the first material may be amorphous carbon. However, spin-on carbon may be used as the first material 301 as well.

FIG. 4E indicates an embodiment according to the current disclosure in which the hard mask comprises a layer of the first material for the purpose of avoiding the etch-stop layer deposition on unwanted, such as open or featureless, areas of the substrate. This layer is indicated by 301' in FIG. 4E.

In the embodiment of FIG. 4E the topmost second material 302 layer may be thin, and comprise silicon. The second material 302 may be, for example silicon nitride or silicon oxide. The layer below the second material layer 302 is first material 301, and under it, there is an additional layer of a first material 301'. In the embodiment of FIG. 4E the two topmost layers are patterned, but the additional layer of a first material 301' remains unpatterned, i.e. continuous. The bottom-most layer of the hard mask comprises second material 302' and is a silicon-containing material. The target material 303 is below the layer 302'. In some embodiments, the two layers of the first material 301 and 301' are different types of first material. In some embodiment, the first material 301 closer to the surface is TiN and the layer of first material closer to the bottom is a carbon layer, such as an amorphous carbon layer. In some embodiments, the first materials 301 and 301' are reversed. Since the thin layer of first material 301' is below the patterned portion of the hard mask, it may extend on areas in which patterning is not performed. This may allow avoiding the deposition of a highly etch-resistant etch-stop layer on unwanted areas, as passivation material will grow on the first material 301' preventing the deposition of the etch-stop material 306.

Figure 5:
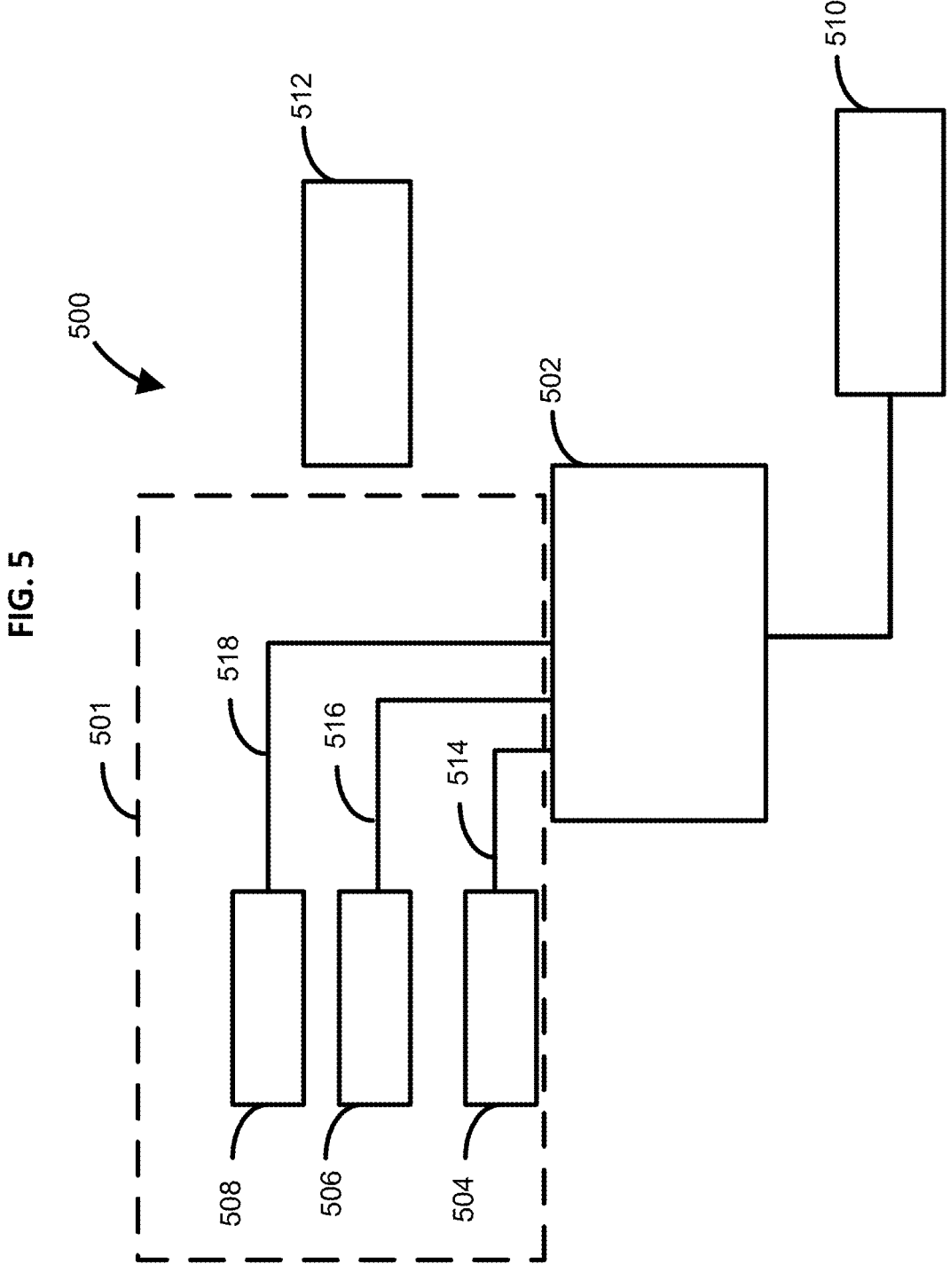
FIG. 5 is a schematic presentation of a deposition assembly according to the current disclosure.

FIG. 5 illustrates a deposition assembly 500 according to the current disclosure in a schematic manner. Deposition assembly 500 can be used to perform a method as described herein and/or to form a structure or a device, or a portion thereof as described herein.

In the illustrated example, deposition assembly 500 includes one or more reaction chambers 502, a precursor injector system 501, a passivation material precursor vessel 504, etch stop material precursor vessel 506, blocking reactant source 508, an exhaust source 510, and a controller 512. The deposition assembly 500 may comprise one or more additional gas sources (not shown), such as an inert gas source, a carrier gas source and/or a purge gas source.

Reaction chamber 502 can include any suitable reaction chamber, such as an ALD or CVD reaction chamber as described herein.

The passivation material precursor vessel 504 can include a vessel and one or more passivation material precursors as described herein-alone or mixed with one or more carrier (e.g., inert) gases. Etch-stop material precursor vessel 506 can include a vessel and one or more etch-stop material precursors as described herein-alone or mixed with one or more carrier gases. Blocking reactant source 508 can include a blocking reactant, or a precursor thereof as described herein, such as a silylation reactant. Although illustrated with three source vessels 504-508, deposition assembly 500 can include any suitable number of source vessels. Source vessels 504-508 can be coupled to reaction chamber 502 via lines 514-518, which can each include flow controllers, valves, heaters, and the like. In some embodiments, the passivation material precursor in the passivation material precursor vessel 504, the etch-stop material precursor in the etch-stop material precursor vessel 506 and/or the blocking reactant in the blocking reactant vessel 508 may be heated.

Exhaust source 510 can include one or more vacuum pumps.

Controller 512 includes electronic circuitry and software to selectively operate valves, manifolds, heaters, pumps and other components included in the deposition assembly 500. Such circuitry and components operate to introduce precursors, reactants and purge gases from the respective sources. Controller 512 can control timing of gas pulse sequences, temperature of the substrate and/or reaction chamber 502, pressure within the reaction chamber 502, and various other operations to provide proper operation of the deposition assembly 500. Controller 512 can include control software to electrically or pneumatically control valves to control flow of precursors, reactants and purge gases into and out of the reaction chamber 502. Controller 512 can include modules such as a software or hardware component, which performs certain tasks. A module may be configured to reside on the addressable storage medium of the control system and be configured to execute one or more processes.

Other configurations of deposition assembly 500 are possible, including different numbers and kinds of precursor and reactant sources. Further, it will be appreciated that there are many arrangements of valves, conduits, precursor sources, and auxiliary reactant sources that may be used to accomplish the goal of selectively and in coordinated manner feeding gases into reaction chamber 502. Further, as a schematic representation of a deposition assembly, many components have been omitted for simplicity of illustration, and such components may include, for example, various valves, manifolds, purifiers, heaters, containers, vents, and/or bypasses.

During operation of deposition assembly 500, substrates, such as semiconductor wafers (not illustrated), are transferred from, e.g., a substrate handling system to reaction chamber 502. Once substrate(s) are transferred to reaction chamber 502, one or more gases from gas sources, such as precursors, reactants, carrier gases, and/or purge gases, are introduced into reaction chamber 502.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method comprising:

providing, in a reaction chamber, a substrate comprising an underlying material and a patterned hard mask disposed on top of the underlying material, wherein the patterned hard mask comprises a first material disposed on top of the underlying material, and a second material disposed on top of the first material, and wherein a gap extends through the first and the second materials to the underlying material;

selectively depositing passivation material on side walls of the first material inside the gap until the deposited passivation material forms a surface covering the gap;

selectively depositing an etch-stop layer on the second material; and etching, within the gap, the passivation material and at least a portion of the underlying material.

2. The method of claim 1, wherein the passivation material is deposited to entirely fill the gap.

3. The method of claim 1, wherein the passivation material is deposited substantially conformally on the side walls of the gap.

4. The method of claim 1, wherein the patterned hard mask comprises a third material and the gap extends through the third material.

5. The method of claim 1, wherein the first material comprises a metal.

6. The method of claim 5, wherein the metal is selected from a group consisting of molybdenum, copper, cobalt, ruthenium, tungsten, niobium, zirconium hafnium and titanium.

7. The method of claim 1, wherein the first material comprises a high k material.

8. The method of claim 1, wherein the first material comprises amorphous carbon.

9. The method of claim 1, wherein the first material or the second material comprises photoresist material.

10. The method of claim 1, wherein the second material comprises silicon.

11. The method of claim 1, wherein the second material comprises silicon oxide, silicon nitride, silicon carbide, silicon oxycarbide or a combination thereof.

12. The method of claim 1, wherein the second material comprises carbon.

13. The method of claim 1, wherein the second material comprises an oxide or a nitride.

14. The method of claim 1, wherein the passivation material is deposited by a cyclic process.

15. The method of claim 1, wherein the passivation material comprises an organic polymer, and the organic polymer comprises polyimide.

16. The method of claim 1, wherein the etch-stop layer comprises a metal oxide.

17. The method of claim 1, wherein the etch-stop layer comprises a metal selected from aluminum, yttrium, zirconium or combinations thereof.

18. The method of claim 1, wherein the etch-stop layer is deposited by a cyclic deposition process.

19. The method of claim 1, wherein the selectively depositing of the passivation material leaves an empty cavity within the gap under the passivation material.

20. The method of claim 1, wherein the etch-stop layer has a higher etch resistivity than the passivation material.

21. The method of claim 1, wherein the passivation material preferentially grows on the first material relative to the second material and relative to the underlying material.

22. A method comprising:

providing a substrate, comprising an underlying material and a patterned hard mask, in a reaction chamber, wherein the patterned hard mask comprises a first material and a second material, wherein the second material forms partially a surface of the substrate, and wherein a gap extends through the first and the second materials to the underlying material;

selectively depositing passivation material on the first material within the gap;

selectively depositing an etch-stop layer on the second material outside of the gap; and selectively etching the passivation material and the underlying material not covered by the patterned hard mask.

23. The method of claim 22, wherein the substrate comprises a first surface comprising a metal and a second surface comprising silicon.

24. The method of claim 22, wherein the passivation material is deposited by a cyclic process.

25. The method of claim 22, wherein the passivation material comprises polyimide.

26. The method of claim 22, wherein the etching creates a gate cut for a FinFET gate.

* * * * *